United States Patent
Romaniuk

(10) Patent No.: US 6,904,100 B1
(45) Date of Patent: Jun. 7, 2005

(54) PULSE CONTROLLED PHASE MODULATOR

(76) Inventor: Charles Christopher Romaniuk, Box 3295, Vermilion, Alberta (CA), T9X 2B2

( * ) Notice: Subject to any disclaimer, the term of this patent is extended or adjusted under 35 U.S.C. 154(b) by 735 days.

(21) Appl. No.: 09/672,509

(22) Filed: Sep. 29, 2000

(51) Int. Cl.[7] ............................................. H04B 10/12
(52) U.S. Cl. ........................................ 375/308; 332/103
(58) Field of Search ................................ 375/295, 308, 375/279, 281; 398/182, 183, 188; 332/103

(56) References Cited

U.S. PATENT DOCUMENTS

| | | |
|---|---|---|
| 4,817,207 A | 3/1989 | Smith et al. |
| 5,274,651 A | 12/1993 | Urakami |
| 6,035,079 A | 3/2000 | Fields et al. |

*Primary Examiner*—Tesfaldet Bocure
*Assistant Examiner*—Pankaj Kumar

(57) ABSTRACT

A pulse controlled phase modulator device converts an unknown phase pulsed input signal to a continuous wave phase modulated output signal. The pulsed input signal activates a switch, such as a saturable absorber operating near saturation, to pulse modulate a dependent signal that has a known phase value. A combiner combines the dependent signal with an independent signal to produce the constant magnitude continuous wave phase modulated output signal. The output signal is a binary phase shift keying signal with the same frequency as the continuous wave input signal. An amplifier or weighted splitter is used to make the dependent signal larger in magnitude than the independent signal and a phase inverter is used to make the dependent and independent signals opposite in phase.

The pulse controlled phase modulator consists of a splitter, an independent stage, a dependent stage, and a combiner. A threshold device is also used on the pulsed dependent signal to inhibit output magnitude variations.

33 Claims, 8 Drawing Sheets

PULSE CONTROLLED PHASE MODULATOR

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO A "MICROFICHE APPENDIX"

Not Applicable

BACKGROUND OF THE INVENTION

1. Field of the Invention

The present invention relates generally to optical phase modulators and relates specifically to optical phase modulators controlled by a pulsed optical input signal.

2. Discussion of Related Art

Optical phase modulators are commonly used devices and are well known in the art. They are useful for converting an electrical, acoustical, or optical signal to an optical signal with a specific phase value. Optical phase modulators have also been developed as optical devices for logic gates and signal receivers. A variety of optical phase modulators are used to provide digital binary phase shift keying (BPSK) modulated signals. However, a more efficient and faster phase modulator which can receive a pulsed input signal of unknown phase, such as a transmission line signal, is needed.

Electro-optic phase modulators are commonly used to phase modulate optical signals using electronic signals. An electronic signal is used to produce an optical effect, such as the Pockels effect or the Kerr effect, thereby modulating the refractive index, and thus the phase delay, of an optical material. These devices are relatively slow and usually require a large electronic signal to produce a large phase shift. As well, using this method a pulsed optical signal must be converted to an electronic signal before it can be used to phase modulate another optical signal. These devices are not well suited for phase modulating one optical signal with another pulsed optical signal, and are not as efficient as an optical pulse controlled phase modulator.

U.S. Pat. No. 5,274,651 describes a method of self-phase modulation that uses a pulsed input signal. The pulsed input signal creates a self-induced intensity-dependent refractive index change and phase modulates itself based on the intensity of the pulsed input signal. A second optical signal can also be used to modulate the refractive index of a first signal according to the intensity of both signals. However, this method does not phase modulate the input signal relative to a known phase value and, therefore, the phase of the signal is still not known after modulation.

In an alternative method, a second optical signal is used to modulate the refractive index of a first signal that has a known phase. However, the optical refractive index change is a relatively weak physical effect, usually requiring large modulating signals and materials with large nonlinear properties.

Some optical phase modulators based on signal interference are used as all-optical logic devices for optically controlled phase modulation. However, these devices are limited to signals with known relative phase values. Pulsed input signals with unknown phase values cannot be properly processed and utilized by these devices because the pulsed input signals, of unknown phase, will not interfere with the device signals, of known phase, as desired.

Other means are also used also for receiving pulsed signals with unknown phase values and converting them to other signals. A heterodyne receiver uses beat interference with a local oscillator to detect a received signal and convert the beat interference to an electronic signal. A homodyne receiver tries to determine the phase of the received signal by combining the received signal with several signals from a local oscillator having various phase values. However, heterodyne and homodyne receivers require some electronic control and are more complex, less efficient, and slower than a pulse controlled phase modulator.

A simpler, more efficient, and dedicated optical phase modulator that can convert a pulsed input signal with unknown phase to a digital BPSK signal is needed.

BRIEF SUMMARY OF THE INVENTION

The pulse controlled phase modulator is a simple device consisting of a splitter, an independent stage, a dependent stage, and a combiner. The splitter receives the continuous wave input signal and divides it into two signals: an independent signal and a dependent signal. Connected to the splitter are the independent stage and the dependent stage. The independent stage produces a processed independent signal and the dependent stage produces a processed dependent signal. The processed independent signal is maintained as a comparison to the processed dependent signal and is used to produce a continuous wave phase modulated output signal. The dependent stage is used to convert the switching mechanism from an unknown phase pulsed input signal to a pulsed processed dependent signal with a known phase that is opposite in phase to and twice the magnitude of the processed independent signal. The processed dependent signal and the processed independent signal are then directed into the combiner which combines them to generate the constant magnitude continuous wave output signal. The magnitude of the processed dependent signal and the magnitude of the processed independent signal are preferably proportioned so that the combiner combines them to produce two possible output signals of equal magnitude and opposite phase.

The pulse controlled phase modulator produces a phase modulated output signal from a pulsed input signal more efficiently than previous methods by using a switch, such as a threshold device, preferably operating near its threshold, in the dependent stage, to pulse modulate the dependent signal with the pulsed input signal. The resulting dependent signal that is pulsed is combined with the independent signal to produce the continuous wave output signal.

The pulse controlled phase modulator receives a continuous wave coherent input signal and a pulsed input signal with unknown phase and produces a continuous wave phase modulated output signal. The output signal is a substantially constant magnitude binary phase shift keying (BPSK) signal with the same frequency as the continuous wave input signal.

DETAILED DESCRIPTION OF THE INVENTION

Figure 1:
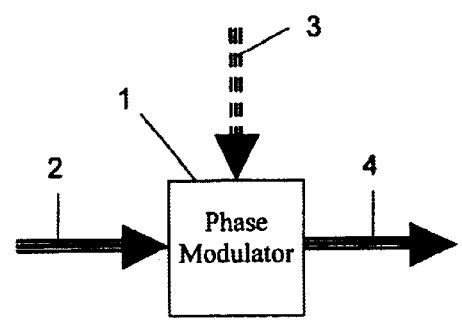
FIG. 1 is a plan view of a pulse controlled phase modulator.
Figure 2:
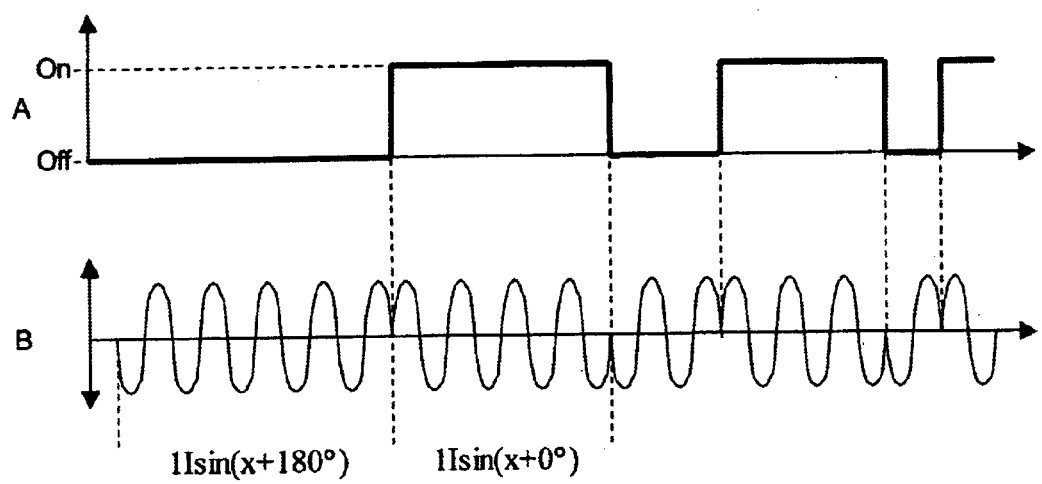
FIG. 2 shows example input and output waveforms of the device of FIG. 1.

Referring to FIG. 1, a pulse controlled phase modulator 1 receives a continuous wave (CW) coherent input signal 2 and a pulsed input signal 3 and produces a continuous wave phase modulated output signal 4. As shown in FIG. 2, the output signal 4, resulting from the pulsed input signal 3, such as a signal A, is a constant magnitude binary phase shift keying (BPSK) signal, such as a signal B, with the same frequency as the CW input signal 2. For example, using the CW input signal 2 as $1I\sin(x+0°)$, when the pulsed input signal 3 is ON, the output signal is $1I\sin(x+0°)$, and when the pulsed input signal 3 is OFF, the output signal 4 is an inverted signal of $1I\sin(x+180°)$ which is equal to $-1I\sin(x+0°)$.

Figure 3:
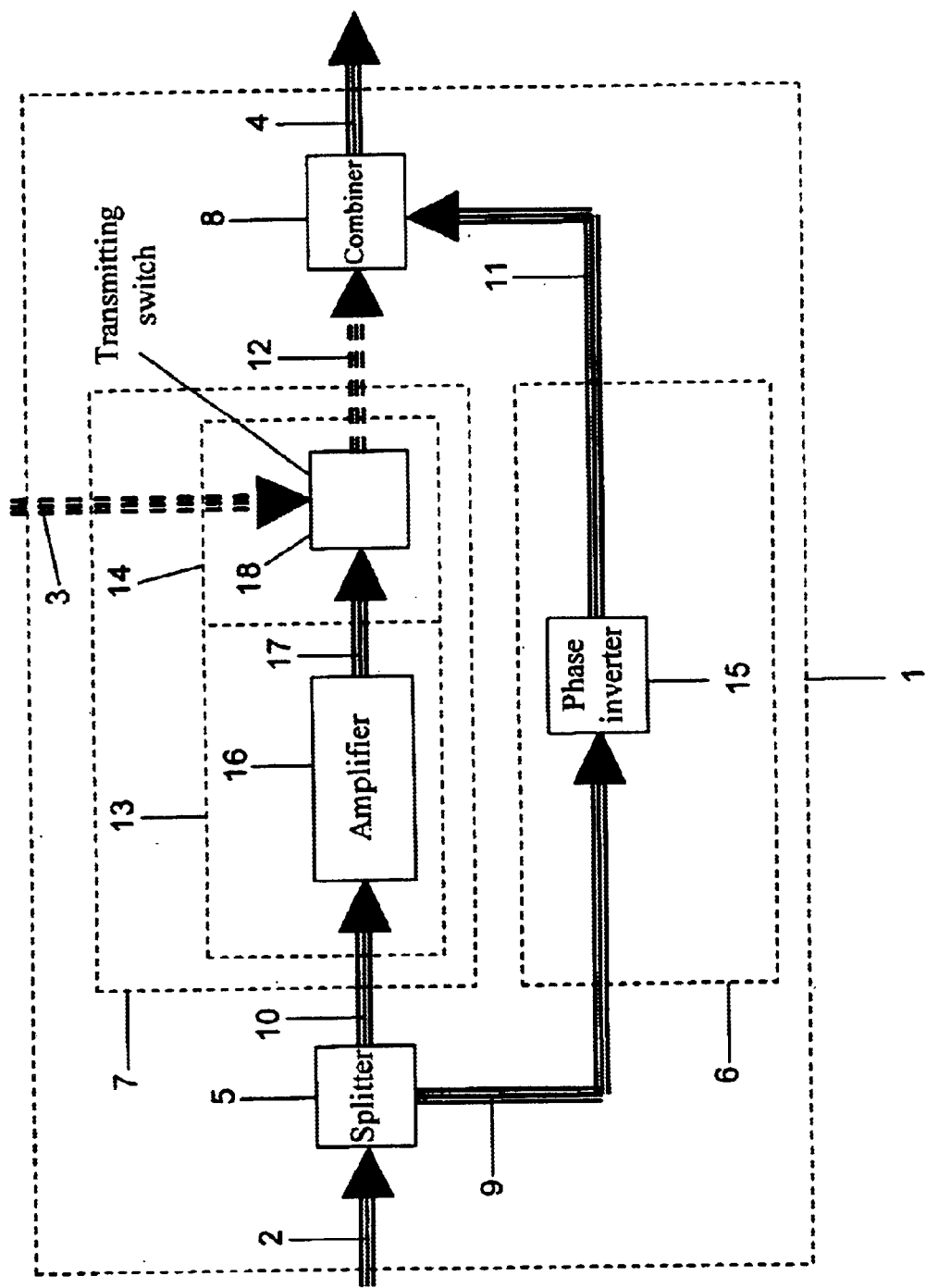
FIG. 3 shows a schematic of a pulse controlled phase modulator of FIG. 1.

As shown in FIG. 3, the pulse controlled phase modulator 1 consists of a splitter 5, an independent stage 6, a dependent stage 7, and a combiner 8. The splitter 5 receives the continuous wave input signal 2 and divides it into two signals: an independent signal 9 and a dependent signal 10. Connected to the splitter 5 are the independent stage 6 and the dependent stage 7. The independent stage 6 produces a processed independent signal 11. In the independent stage 6, the independent signal 9 is maintained as a comparison to the dependent signal 10 and is used to produce the phase modulated output signal 4 that is a continuous wave signal.

The dependent stage 7 is used to convert the switching mechanism from the unknown phase pulsed input signal 3 to a pulsed processed dependent signal 12 with a phase opposite to and a magnitude preferably twice that of the processed independent signal 11.

The dependent stage 7 has two sections: an amplifying section 13 and a switching section 14. The amplifying section 13 increases the magnitude of the dependent signal 10 so that it is preferably twice the magnitude of the processed independent signal 11 and the switching section 14 converts the dependent signal 10 from a continuous wave signal to a pulsed signal.

The processed independent signal 11 and the processed dependent signal 12 are then directed into the combiner 8 which combines them to produce the continuous wave phase modulated output signal 4.

The following description illustrates the pulse controlled phase modulator 1 operation and implementation by way of example only.

The CW input signal 2 is an externally generated continuous wave coherent signal with a preferably fixed frequency, phase, and magnitude. The CW input signal 2 is preferably a laser beam. For example, the CW input signal 2 can be expressed as $$\text{Input}=2I\sin(x+0°)$$

where I is a relative measure of magnitude.

Referring to FIG. 3, the CW input signal 2 is directed into the input of the splitter 5. The splitter 5 can be any suitable splitter known in the art, such as an integrated optic Y-branch or directional coupler. The splitter 5 receives the CW input signal 2 and divides it into two preferably equal signals: the independent signal 9 and the dependent signal 10. For example, the splitter 5, receiving the CW input signal 2 above, will produce the independent signal 9 and the dependent signal 10 of $$\text{Independent}=1I\sin(x+0°)$$

$$\text{Dependent}=1I\sin(x+0°)$$

The independent signal 9 is directed into the independent stage 6 and the dependent signal 10 is directed into the dependent stage 7.

The independent stage 6 consists of a phase inverter 15, such as a half-integral pathlength. The phase inverter 15 receives the independent signal 9 and inverts its phase to produce the processed independent signal 11 so that the processed independent signal 11 is 180° out of phase with (opposite in phase to) the independent signal 9. For example, the phase inverter 15 will produce the processed independent signal 11 of $$\text{Processed Independent}=1I\sin(x+180°)=-1I\sin(x+0°)$$

The processed independent signal 11 is then directed into the combiner 8.

The dependent stage 7 receives the dependent signal 10 and is composed of the amplifying section 13 and the switching section 14.

The amplifying section 13 receives the dependent signal 10 and consists of an amplifier 16, such as a semiconductor laser amplifier or an erbium-doped waveguide. The amplifier 16 receives the dependent signal 10 and increases its magnitude to produce an amplified signal 17. The amplification of the amplifier 16 is set so that the resulting amplified signal 17 is preferably twice the magnitude of the processed independent signal 11. For example, the amplifier 16 with an amplification factor of 2 will produce the amplified signal 17 of $$\text{Amplified}=2I\sin(x+0°)$$

The switching section 14 receives the amplified signal 17 and consists of a transmitting switch 18, preferably a saturable absorber operating near saturation. The transmitting switch 18 receives the amplified signal 17 and the pulsed input signal 3 and produces the processed dependent signal 12. If the pulsed input signal 3 is ON, the transmitting switch 18 transmits partially, or preferably entirely, the amplified signal 17, which becomes the probed dependent signal 12. For example, if the pulsed input signal 3 is ON, the processed dependent signal 12 is $$\text{Processed Dependent}=2I\sin(x+0°)$$

If the pulsed input signal 3 is OFF, the transmitting switch 18 does not transmit the amplified signal 17 and the processed dependent signal 12 is preferably negligible. For example, if the pulsed input signal 3 is OFF, the processed dependent signal 12 is $$\text{Processed Dependent}=0$$

The processed dependent signal 12 is then directed into the combiner 8. The combiner 8 can be any suitable combiner known in the art, such as an integrated optic Y-branch or directional coupler. The combiner 8 combines the processed independent signal 11 and the processed dependent signal 12 to produce the output signal 4. For example, the combiner 8 produces two possible output signals 4, $$\text{Output}=1I\sin(x+0°)$$

if the pulsed input signal 3 is ON, and $$\text{Output}=1I\sin(x+180°)=-1I\sin(x+0°)$$

if the pulsed input signal 3 is OFF. The output signal 4 is a continuous wave signal with constant magnitude and one of two relative phase values that are opposite in phase.

Preferably, none of the components modify the frequency or polarization of the signals as they propagate through the pulse controlled phase modulator device 1.

Table 1 summarizes the magnitudes and phases of the signals in the pulse controlled phase modulator 1 for the two cases when the pulsed input signal 3 is ON and when the pulsed input signal 3 is OFF.

The dependent stage 107 receives the dependent signal 1010 and is composed of the switching section 1014 and the amplifying section 1013.

The switching section 1014 receives the dependent signal 1010 and consists of a transmitting switch 1018, preferably a threshold device operating near its threshold, such as a saturable absorber operating near saturation. The transmitting switch 1018 receives the dependent signal 1010 and a pulsed input signal 103 and produces the switched signal 21. If the pulsed input signal 103 is ON, the transmitting switch 1018 transmits partially, or preferably entirely, the dependent signal 1010, which becomes the switched signal 21. If the pulsed input signal 103 is OFF, the transmitting switch 1018 does not transmit the dependent signal 1010 and the switched signal 21 is preferably negligible.

The amplifying section 1013 receives the switched signal 21 and is composed of the boosting segment 19 and the filtering segment 20. The boosting segment 19 consists of an amplifier 1016 and receives the switched signal 21. The

TABLE 1

| Signal | Pulsed Input Signal 3 | CW Input Signal 2 | Independent Signal 9 | Dependent Signal 10 | Amplified Signal 17 | Processed Dependent Signal 12 | Processed Independent Signal 11 | Output Signal 4 |
|---|---|---|---|---|---|---|---|---|
| Value | ON | 2 | 1 | 1 | 2 | 2 | −1 | 1 |
| Value | OFF | 2 | 1 | 1 | 2 | 0 | −1 | −1 |

The processed dependent signal 12 does not have to be twice the magnitude of the processed independent signal 11. However, the processed dependent signal 12 and the processed independent signal 11 should combine to produce two possible output signal 4 values of equal magnitude and opposite phase.

Figure 4:
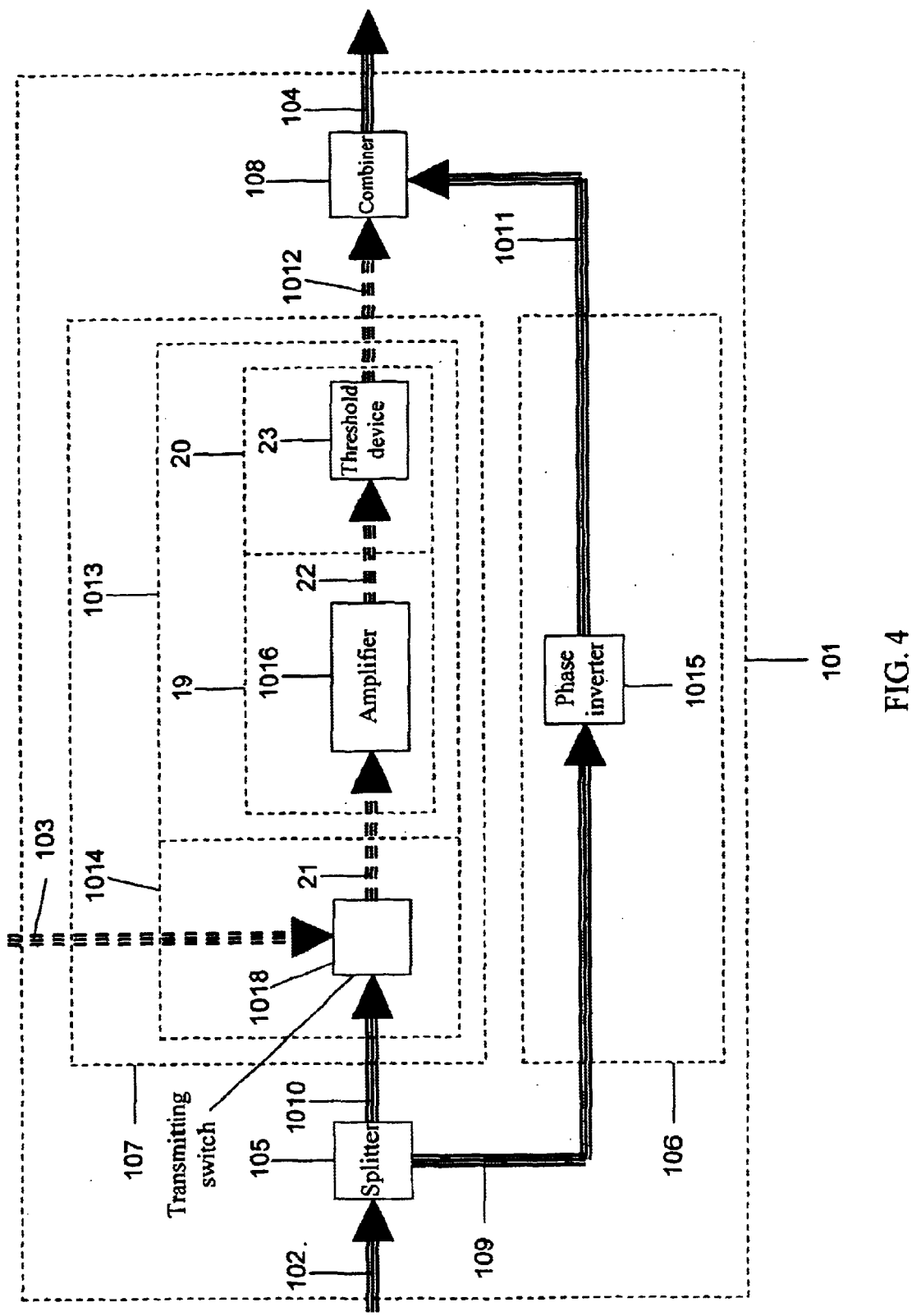
FIG. 4 is an alternative embodiment of FIG. 1.

An alternative embodiment of the pulse controlled phase modulator 1 is shown in FIG. 4 where like numerals with a prefix 10 refer to similar elements of the pulse controlled phase modulator 1 in FIG. 3. The order of an amplifying section 1013 and a switching section 1014, in a dependent stage 107 of a pulse controlled phase modulator 101, is reversed so that the amplifying section 1013 follows the switching section 1014. Also, the amplifying section 1013 is subdivided into a boosting segment 19 and a filtering segment 20. The boosting segment 19 is used to increase the magnitude of a switched signal 21, producing a boosted signal 22. The filtering segment 20 is used to make the resulting boosted signal 22, which becomes a processed dependent signal 1012, either a negligible signal or the processed dependent signal 1012 with a magnitude preferably twice that of a processed independent signal 1011. The filtering segment 20 is useful for suppressing unwanted boosted signals 22, such as spontaneous emission signals in a semiconductor laser amplifier. A threshold device 23, such as a saturable absorber, is used in the filtering segment 20.

A CW input signal 102 is directed into the input of a splitter 105 which divides the CW input signal 102 into two preferably equal signals: an independent signal 109 and a dependent signal 1010. The independent signal 109 is directed into an independent stage 106 and the dependent signal 1010 is directed into the dependent stage 107.

The independent stage 106 receives the independent signal 109 and consists of a phase inverter 1015. The phase inverter 1015 receives the independent signal 109 and inverts its phase to produce the processed independent signal 1011, so that the processed independent signal 1011 is opposite in phase to the independent signal 109. The processed independent signal 1011 is then directed into a combiner 108.

amplifier 1016 increases the magnitude of the switched signal 21 to produce the boosted signal 22. The amplification of the amplifier 1016 is set so that the resulting dependent signal 1012 is preferably twice the magnitude of the processed independent signal 1011.

The filtering segment 20 receives the boosted signal 22 and transmits the boosted signal 22 when it is larger in magnitude than, or equal in magnitude to, a threshold value, such as when the pulsed input signal 103 is ON. The filtering segment 20 does not transmit the boosted signal 22 when it is smaller in magnitude than the threshold value, such as when the pulsed input signal 103 is OFF and a small spontaneous noise signal is generated by a semiconductor laser amplifier in the boosting segment 19. The filtering segment 20 consists of a threshold device 23, such as a saturable absorber. The threshold device 23 receives the boosted signal 22 and produces the processed dependent signal 1012. If the magnitude of the boosted signal 22 is less than the threshold value of the threshold device 23, the boosted signal 22 is not transmitted and the processed dependent signal 1012 is negligible. If the magnitude of the boosted signal 22 is greater than, or equal to, the threshold value of the threshold device 23, the boosted signal 22 is transmitted partially, or preferably entirely, and becomes the processed dependent signal 1012. The processed dependent signal 1012 is then directed into the combiner 108.

The combiner 108 receives the processed independent signal 1011 and the processed dependent signal 1012 and combines them to produce an output signal 104. The output signal 104 is a continuous wave signal with constant magnitude and one of two relative phase values that are opposite in phase.

Preferably, none of the components modify the frequency or polarization of the signals as they propagate through the pulse controlled phase modulator device 101.

Table 2 summarizes the magnitudes and phases of example signals in the pulse controlled phase modulator 101 for the two cases when the pulsed input signal 103 is ON and when the pulsed input signal 103 is OFF.

TABLE 2

| Signal | Pulsed Input Signal 103 | CW Input Signal 102 | Independent Signal 109 | Dependent Signal 1010 | Switched Signal 21 | Boosted Signal 22 | Processed Dependent Signal 1012 | Processed Independent Signal 1011 | Output Signal 104 |
|---|---|---|---|---|---|---|---|---|---|
| Value | ON | 2 | 1 | 1 | 1 | 2 | 2 | −1 | 1 |
| Value | OFF | 2 | 1 | 1 | 0 | 1/10 | 0 | −1 | −1 |

Figure 5:
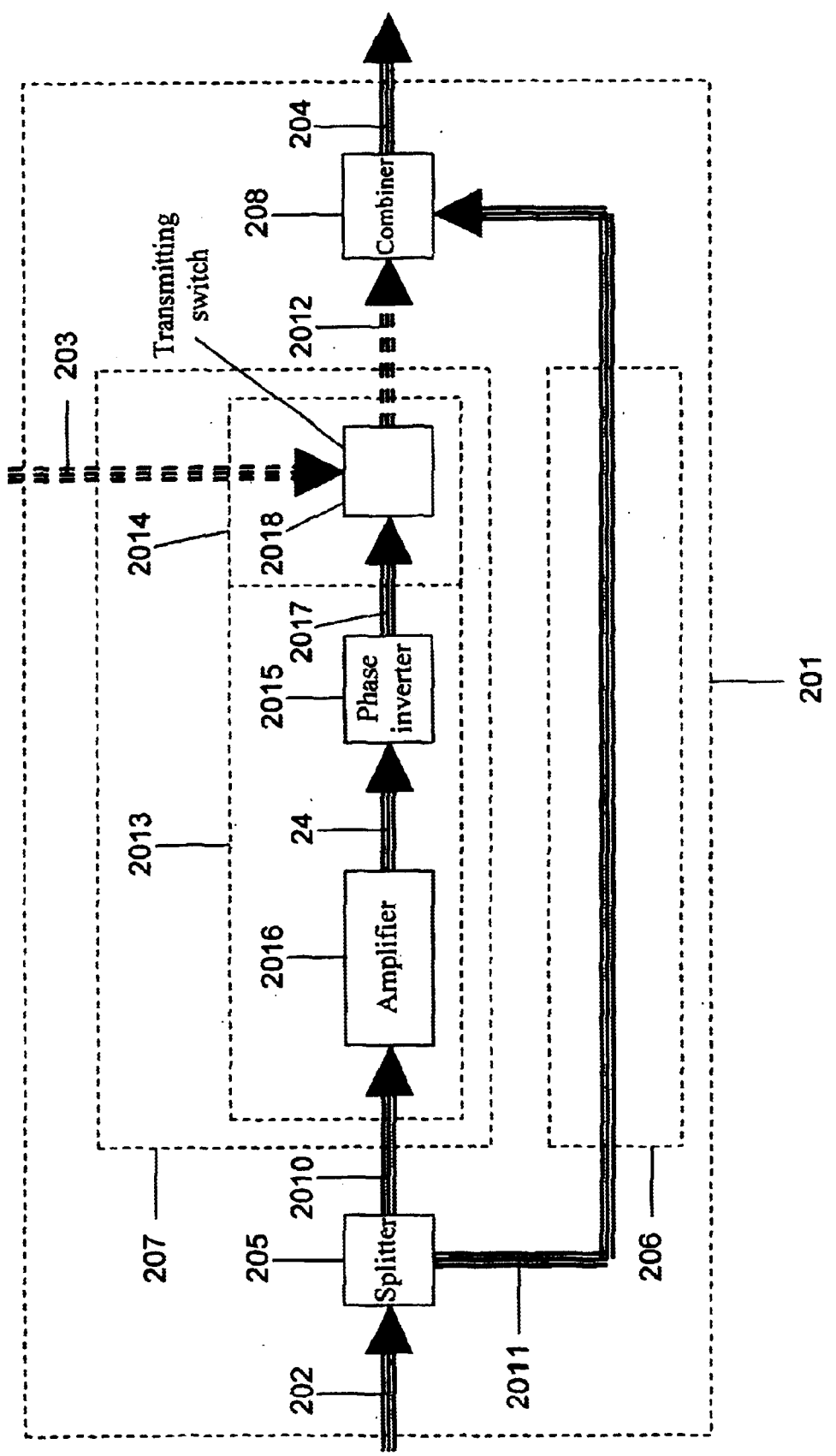
FIG. 5 is a further alternative embodiment of FIG. 1.

A further alternative embodiment of the pulse controlled phase modulator 1 is shown in FIG. 5, where like numerals with a prefix 20 refer to similar elements of the pulse controlled phase modulators 1, 101 in FIG. 3 and FIG. 4. In a pulse controlled phase modulator 201, a phase inverter 2015 is placed after an amplifier 2016 in an amplifying section 2013 of a dependent stage 207. A phase inverter is not used in an independent stage 206.

A CW input signal 202 is directed into the input of a splitter 205. The splitter 205 receives the CW input signal 202 and divides it into two preferably equal signals: a processed independent signal 2011 and a dependent signal 2010. The processed independent signal 2011 is directed into the independent stage 206 and the dependent signal 2010 is directed into the dependent stage 207.

The independent stage 206 preferably does not alter the processed independent signal 2011 so that it is transmitted through the independent stage 206 and is directed into a combiner 208.

The dependent stage 207 receives the dependent signal 2010 and is composed of the amplifying section 2013 and a switching section 2014.

The amplifying section 2013 receives the dependent signal 2010 and consists of the amplifier 2016 and the phase inverter 2015. The amplifier 2016 receives the dependent signal 2010 and increases the magnitude of the dependent signal 2010 to produce an augmented signal 24. The amplification of the amplifier 2016 is set so that a resulting dependent signal 2012 is preferably twice the magnitude of the processed independent signal 2011.

The augmented signal 24 is then directed into the phase inverter 2015. The phase inverter 2015 inverts the phase of the augmented signal 24 to produce an amplified signal 2017 that is opposite in phase to the augmented signal 24.

The switching section 2014 receives the amplified signal 2017 and consists of a transmitting switch 2018, preferably a threshold device operating near its threshold, such as a saturable absorber operating near saturation. The transmitting switch 2018 receives the amplified signal 2017 and a pulsed input signal 203 and produces the processed dependent signal 2012. If the pulsed input signal 203 is ON, the transmitting switch 2018 transmits partially, or preferably entirely, the amplified signal 2017 which becomes the processed dependent signal 2012. If the pulsed input signal 203 is OFF, the transmitting switch 2018 does not transmit the amplified signal 2017, and the processed dependent signal 2012 is preferably negligible. The processed dependent signal 2012 is then directed into the combiner 208.

The combiner 208 combines the processed independent signal 2011 and the processed dependent signal 2012 to produce an output signal 204. The output signal 204 is a continuous wave signal with constant magnitude and one of two relative phase values that are opposite in phase. Because the phase inverter 2015 is placed in the dependent stage 207 instead of the independent stage 206, the output signal 204 is inverted with respect to the output signals 4, 104 of the previous embodiments of the pulse controlled phase modulator 1, 101.

Preferably, none of the components modify the frequency or polarization of the signals as they propagate through the pulse controlled phase modulator device 201.

Table 3 summarizes the magnitudes and phases of example signals in the pulse controlled phase modulator 201 for the two cases when the pulsed input signal 203 is ON and when the pulsed input signal 203 is OFF.

TABLE 3

| Signal | Pulsed Input Signal 203 | CW Input Signal 202 | Processed Independent Signal 2011 | Dependent Signal 2010 | Augmented Signal 24 | Transmitted Signal 2017 | Processed Dependent Signal 2012 | Processed Independent Signal 2011 | Output Signal 204 |
|---|---|---|---|---|---|---|---|---|---|
| Value | ON | 2 | 1 | 1 | 2 | −2 | −2 | 1 | −1 |
| Value | OFF | 2 | 1 | 1 | 2 | −2 | 0 | 1 | 1 |

Figure 6:
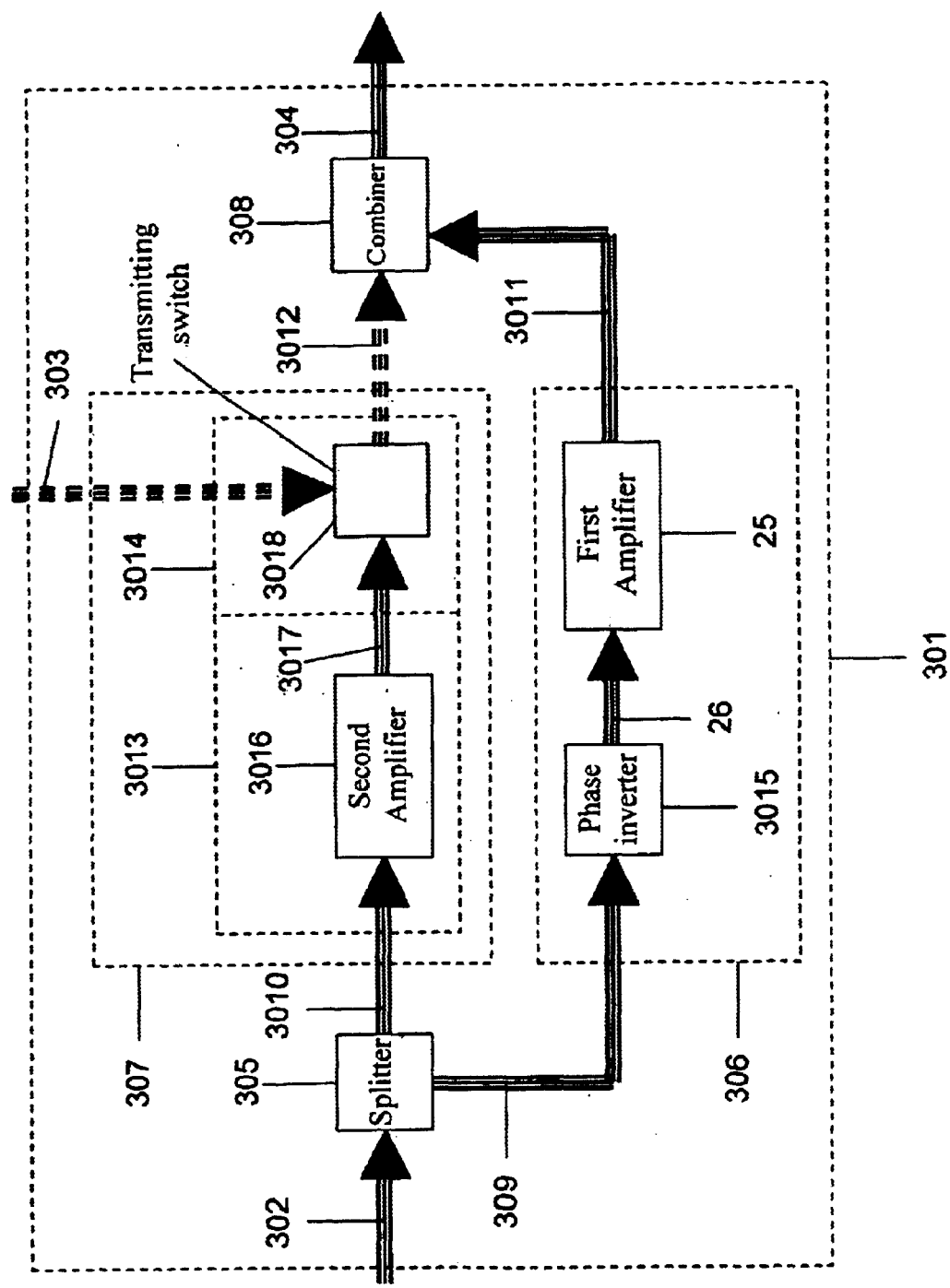
FIG. 6 is another alternative embodiment of FIG. 1.

FIG. 6 shows a further alternative embodiment of the pulse controlled phase modulator 1, where like numerals with a prefix 30 refer to similar elements of the pulse controlled phase modulators 1, 101, 201 in FIG. 3, FIG. 4, and FIG. 5. In a pulse controlled phase modulator 301, a first amplifier 25 is placed in an independent stage 306 and the amplification of an amplifying section 3013 in a dependent stage 307 is increased, producing a larger magnitude output signal 304 than the output signals 4, 104, 204 of the previous embodiments of the pulse controlled phase modulator 1, 101, 201.

A CW input signal 302 is directed into the input of a splitter 305. The splitter 305 receives the CW input signal 302 and divides it into two preferably equal signals: an independent signal 309 and a dependent signal 3010. The independent signal 309 is directed into the independent stage 306 and the dependent signal 3010 is directed into the dependent stage 307.

The independent stage 306 consists of a phase inverter 3015 and the first amplifier 25. The phase inverter 3015 receives the independent signal 309 and inverts its phase to produce an inverted independent signal 26 that is opposite in phase to the independent signal 309.

The first amplifier 25 receives the inverted independent signal 26 and increases its magnitude to produce a processed independent signal 3011. The amplification of the first amplifier 25 is set so that the resulting processed independent signal 3011 is preferably half the magnitude of a processed dependent signal 3012. The processed independent signal 3011 is directed into a combiner 308.

The dependent stage 307 receives the dependent signal 3010 and is composed of the amplifying section 3013 and a switching section 3014.

The amplifying section 3013 receives the dependent signal 3010 and consists of a second amplifier 3016. The second amplifier 3016 increases the magnitude of the dependent signal 3010 to produce an amplified signal 3017. The amplification of the second amplifier 3016 is set so that the resulting dependent signal 3012 is preferably twice the magnitude of the processed independent signal 3011.

The switching section 3014 receives the amplified signal 3017 and consists of a transmitting switch 3018, preferably a threshold device operating near its threshold, such as a saturable absorber operating near saturation. The transmitting switch 3018 receives the amplified signal 3017 and a pulsed input signal 303 and produces a processed dependent signal 3012. If the pulsed input signal 303 is ON, the transmitting switch 3018 transmits partially, or preferably entirely, the amplified signal 3017, which becomes the processed dependent signal 3012. If the pulsed input signal 303 is OFF, the transmitting switch 3018 does not transmit the amplified signal 3017 and the processed dependent signal 3012 is preferably negligible. The processed dependent signal 3012 is directed into the combiner 308.

The combiner 308 combines the processed independent signal 3011 and the processed dependent signal 3012 to produce an output signal 304. The output signal 304 is a continuous wave signal with constant magnitude and one of two relative phase values that are opposite in phase.

Preferably, none of the components modify the frequency or polarization of the signals as they propagate through the pulse controlled phase modulator device 301.

Table 4 summarizes the magnitudes and phases of example signals in the pulse controlled phase modulator 301 for the two cases when the pulsed input signal 303 is ON and when the pulsed input signal 303 is OFF.

$$\text{Independent} = 1I\ \sin(x + 0°)$$

$$\text{Dependent} = 4I\ \sin(x + 0°)$$

The independent signal 409 is directed into the independent stage 406 and the dependent signal 4010 is directed into a dependent stage 407.

The independent stage 406 consists of a phase inverter 4015 and the amplifier 4025. The phase inverter 4015 receives the independent signal 409 and inverts its phase to produce an inverted independent signal 4026 that is opposite in phase to the independent signal 409. For example, the inverted independent signal 4026 is $$\text{Inverted Independent} = 1I\ \sin(x + 180°) = -1I\ \sin(x + 0°)$$

The amplifier 4025 receives the inverted independent signal 4026 and increases the magnitude of the inverted independent signal 4026 to produce a processed independent signal 4011. The amplification of the amplifier 4025 is set so that the resulting processed independent signal 4011 is preferably half the magnitude of a processed dependent signal 4012. For example, the amplifier 4025, with an amplification factor of 2, produces the processed independent signal 4011 of $$\text{Processed Independent} = -2I\ \sin(x + 0°)$$

The processed independent signal 4011 is directed into a combiner 408.

The dependent stage 407 receives the dependent signal 4010 and is composed of the amplifying section 4013 and a switching section 4014.

The amplifying section 4013 preferably does not alter the dependent signal 4010 so that it is transmitted through the amplifying section 4013.

The switching section 4014 receives the dependent signal 4010 and consists of a transmitting switch 4018, preferably a threshold device operating near its threshold, such as a saturable absorber operating near saturation. The transmit-

TABLE 4

| Signal | Pulsed Input Signal 303 | CW Input Signal 302 | Independent Signal 309 | Inverted Independent Signal 26 | Dependent Signal 3010 | Amplified Signal 3017 | Processed Dependent Signal 3012 | Processed Independent Signal 3011 | Output Signal 304 |
|---|---|---|---|---|---|---|---|---|---|
| Value | ON | 2 | 1 | −1 | 1 | 4 | 4 | −2 | 2 |
| Value | OFF | 2 | 1 | −1 | 1 | 4 | 0 | −2 | −2 |

Figure 7:
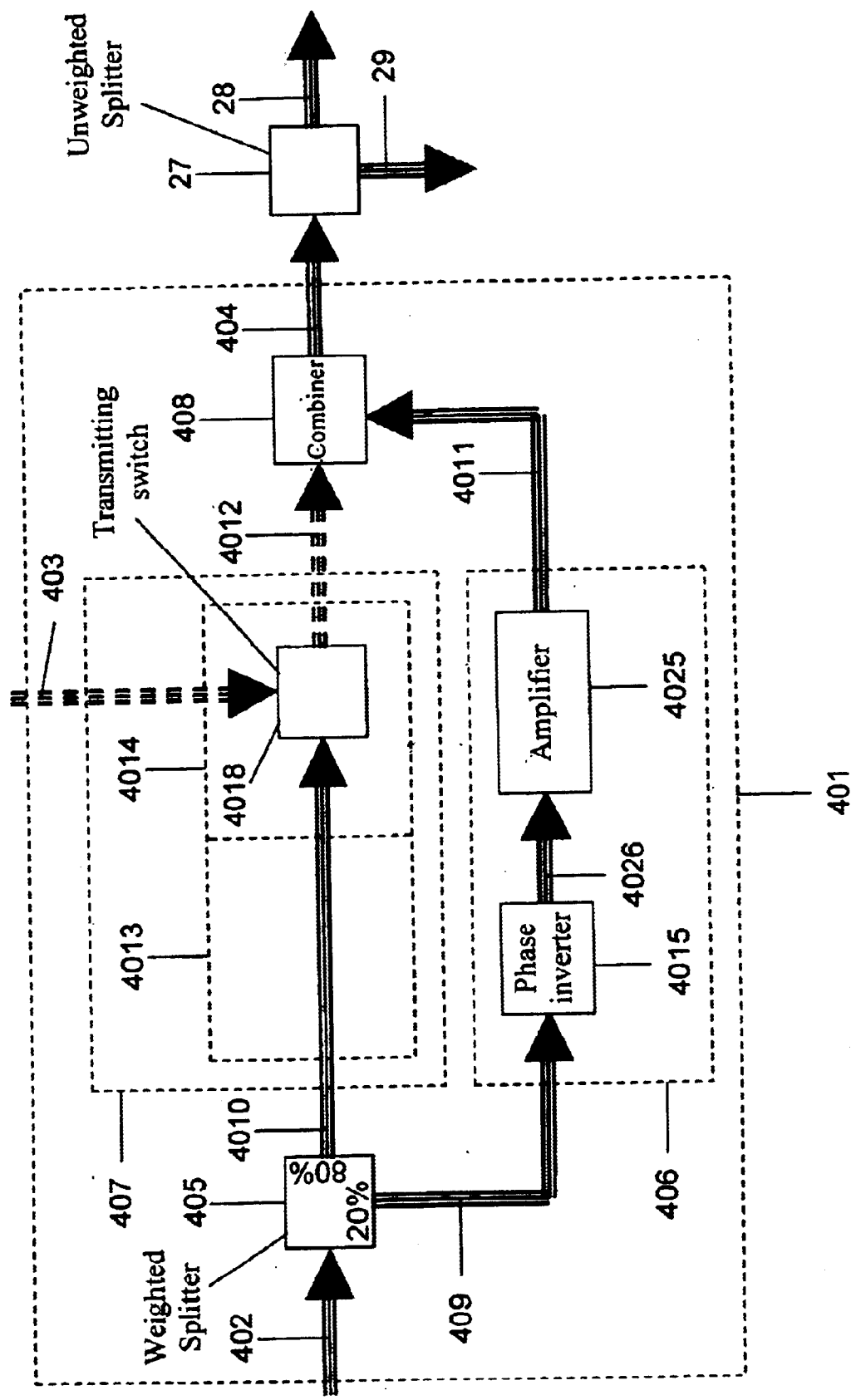
FIG. 7 is another alternative embodiment of FIG. 1.

FIG. 7 shows a further alternative embodiment of the pulse controlled phase modulator 1 where like numerals with a prefix 40 refer to similar elements of the pulse controlled phase modulators 1, 101, 201, 301 in FIG. 3, FIG. 4, FIG. 5, and FIG. 6. In a pulse controlled phase modulator 401, a splitter 405 is weighted so that an independent signal 409 and a dependent signal 4010 are not equal in magnitude and an amplifier in an amplifying section 4013 is not required. An amplifier 4025 is used in an independent stage 406.

A CW input signal 402 is directed into the input of the weighted splitter 405. The weighted splitter 405 receives the CW input signal 402 and divides it into two signals: the independent signal 409 and the dependent signal 4010. For example, the weighted splitter 405 splits in the ratio of 1:4 and from the CW input signal 402

$$\text{Input} = 5I\ \sin(x + 0°)$$

produces the independent signal 409 and the dependent signal 4010 of ting switch 4018 receives the dependent signal 4010 and a pulsed input signal 403 and produces the processed dependent signal 4012. If the pulsed input signal 403 is ON, the transmitting switch 4018 transmits partially, or preferably entirely, the dependent signal 4010, which becomes the processed dependent signal 4012. For example, if the pulsed input signal 403 is ON, the processed dependent signal 4012 is $$\text{Processed Dependent} = 4I\ \sin(x + 0°)$$

If the pulsed input signal 403 is OFF, the transmitting switch 4018 does not transmit the dependent signal 4010 and the processed dependent signal 4012 is preferably negligible. For example, if the pulsed input signal 403 is OFF, the processed dependent signal 4012 is $$\text{Processed Dependent} = 0$$

The processed dependent signal 4012 is directed into the combiner 408.

The combiner 408 combines the processed independent signal 4011 and the processed dependent signal 4012 to produce an output signal 404. For example, the combiner 408 produces two possible output signals 404, Output=2*I* sin(*x*+0°)

if the pulsed input signal 403 is ON, and

Output=2*I* sin(*x*+180°)=−2*I* sin(*x*+0°)

if the pulsed input signal 403 is OFF. The output signal 404 is a continuous wave signal with constant magnitude and one of two relative phase values that are opposite in phase.

Preferably, none of the components modify the frequency or polarization of the signals as they propagate through the pulse controlled phase modulator device 401.

Table 5 summarizes the magnitudes and phases of the example signals in the pulse controlled phase modulator 401 for the two cases when the pulsed input signal 403 is ON and when the pulsed input signal 403 is OFF.

TABLE 5

| Signal | Pulsed Input Signal 403 | CW Input Signal 402 | Independent Signal 409 | Inverted Independent Signal 4026 | Dependent Signal 4010 | Processed Dependent Signal 4012 | Processed Independent Signal 4011 | Output Signal 404 |
|---|---|---|---|---|---|---|---|---|
| Value | ON | 5 | 1 | −1 | 4 | 4 | −2 | 2 |
| Value | OFF | 5 | 1 | −1 | 4 | 0 | −2 | −2 |

The magnitude of the output signal 404 is twice the magnitude of the output signals 4, 104, 204 of the first three embodiments of the pulse controlled phase modulator 1, 101, 201 and can be used with an external unweighted splitter 27 to provide two output signals 28, 29, as shown in Table 6 and FIG. 7, that are equal magnitude to the output signals 4, 104, 204 of the first three embodiments of the pulse controlled phase modulator 1, 101, 201.

TABLE 6

| Signal | Output Signal 404 | First Output Signal 28 | Second Output Signal 29 |
|---|---|---|---|
| Value | 2 | 1 | 1 |
| Value | −2 | −1 | −1 |

The phase inverter 15 may be placed anywhere in either the dependent stage 7 or the independent stage 6. However, if more than one phase inverter is used, the total number of phase inverters in the pulse controlled phase modulator 1 is preferably odd so that the processed independent signal 11 and the processed dependent signal 12 are opposite in phase.

Figure 8:
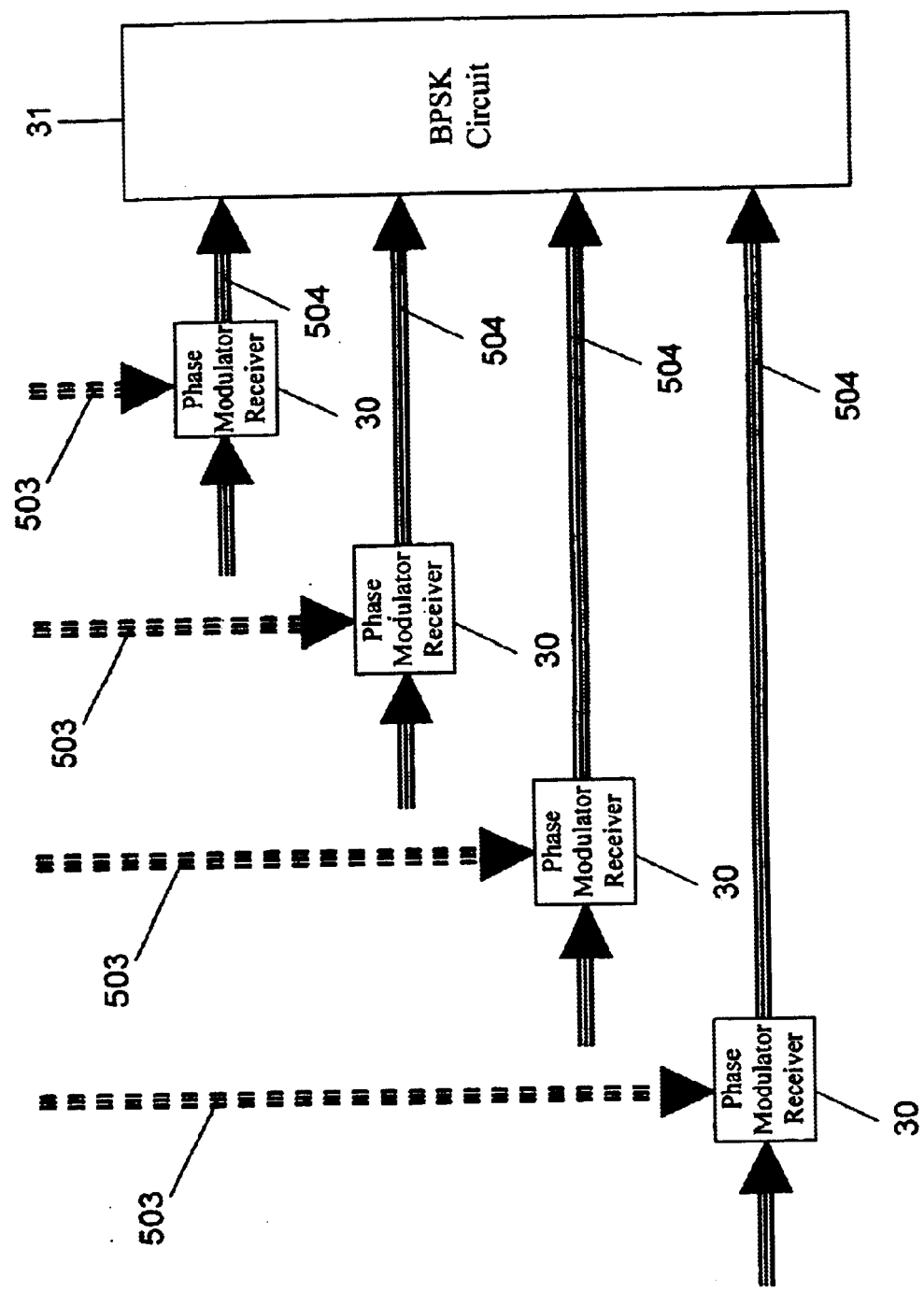
FIG. 8 is a schematic of a circuit using a pulse controlled phase modulator of FIG. 1 as an external signal receiver.

The pulse controlled phase modulator 1 can be used as a receiver for converting an external pulsed input signal 3, with an unknown phase value, to a binary phase shift keying (BPSK) modulated signal 4 for use in a BPSK circuit. The external pulsed input signal 3 can be a signal from an adjacent circuit or from a fiber optic transmission line. For example, as shown in FIG. 8, four external pulsed input signals 503, with unknown phase values, are received by four pulse controlled phase modulators 1 functioning as receivers 30. The receivers 30 convert the external pulsed input signals 503 to phase modulated signals 504 that are received by a BPSK circuit 31.

Figure 9:
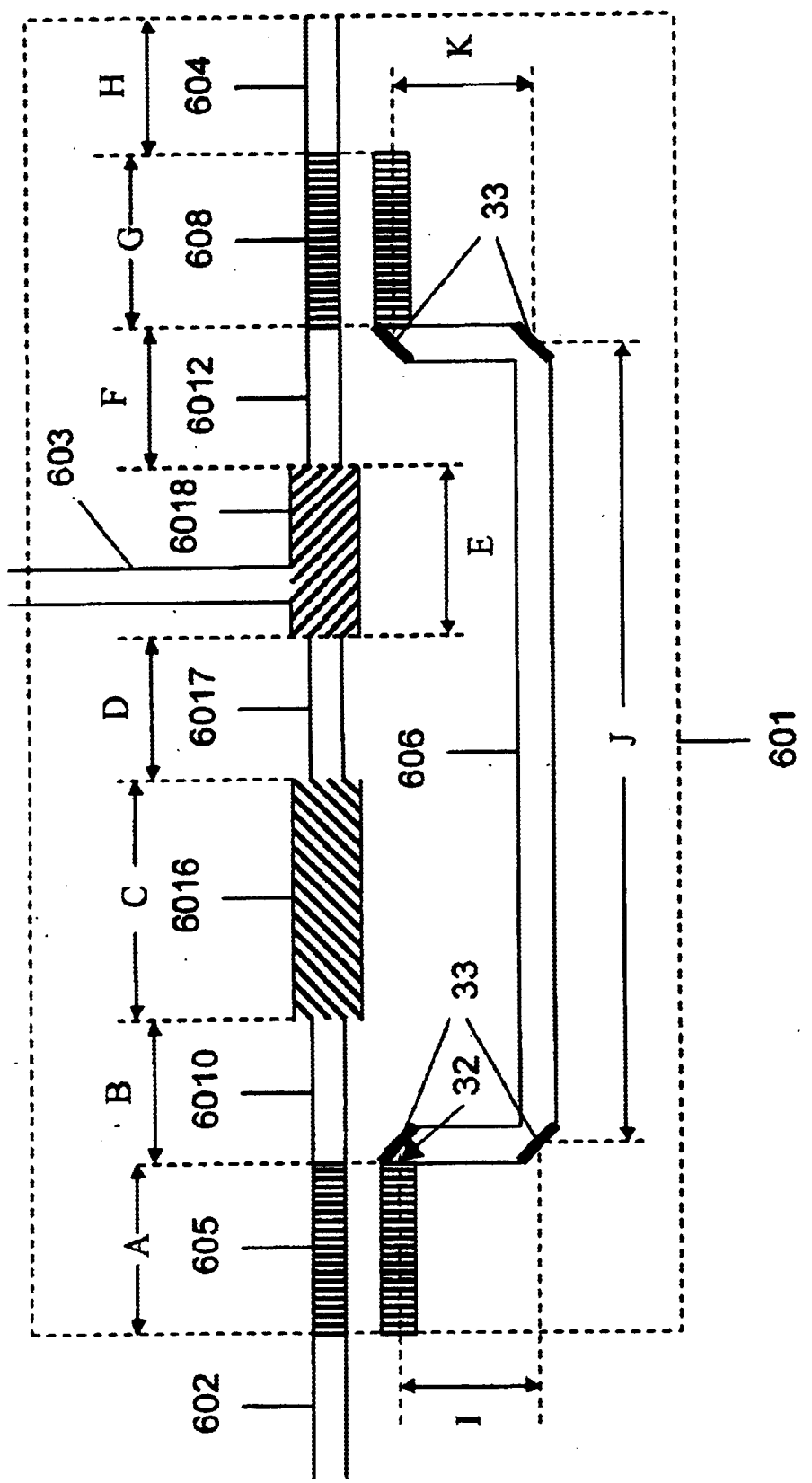
FIG. 9 is a design example of FIG. 3.

An integrated optic embodiment of the pulse controlled phase modulator 1 employs commonly available integrated optic components and operates using laser beams, preferably. A design example pulse controlled phase modulator 601 is shown in FIG. 9 where like numerals with a prefix 60 refer to similar elements of the pulse controlled phase modulator 1 in FIG. 3. The design example pulse controlled phase modulator 601 uses laser light with a wavelength of 0.85 $\mu$m. The component dimensions are listed in Table 7.

TABLE 7

| Component | Length |
|---|---|
| A | 157.1 $\mu$ml |
| B | 42.9 $\mu$m |
| C | 100.0 $\mu$m |
| D | 16.6 $\mu$m |
| E | 100.0 $\mu$m |
| F | 49.8 $\mu$m |
| G | 123.1 $\mu$m |
| H | 26.9 $\mu$m |
| I | 18.0 $\mu$m |
| J | 314.0 $\mu$m |
| K | 18.0 $\mu$m |

Integrated optic directional couplers 605, 608 are used for the splitter 5 and the combiner 8. Interconnecting waveguides 602, 6010, 6017, 603, 6012, 604, 606 are used to direct signals from component to component. The directional couplers 605, 608 and the waveguides 602, 6010, 6017, 603, 6012, 604, 606 are composed of $Al_{0.3}Ga_{0.7}As$, have a substrate of $Al_{0.8}Ga_{0.2}As$, and have air above the waveguide. The directional couplers 605, 608 have a waveguide spacing of 1 $\mu$m and a coupling coefficient of 0.005 $\mu m^{-1}$. The directional couplers 605, 608 and the waveguides 602, 6010, 6017, 603, 6012, 604, 606 are rib waveguides with a rib width of 1 $\mu$m and a rib height of 500 nm where the rib is etched 200 nm. The rib waveguides have an effective index of refraction of 3.247.

A semiconductor laser amplifier 6016 is used for the amplifier 16 and is typically composed of AlGaAs or InGaAsP. The semiconductor laser amplifier 6016 in this design example has an effective index of refraction of 4. The phase inverter 15 is implemented by using a second output port 32 of the first directional coupler 605 which provides an inverted signal. A semiconductor saturable absorber 6018, such as impurity doped GaAs, is used as the transmitting switch 18. The saturable absorber 6018 in this example has an effective index of refraction of 3.5.

The length of the independent stage waveguide 606, from the output of the splitter directional coupler 605 to the input of the combiner directional coupler 608 as indicated by I, J, and K, is an integral number of wavelengths since the splitter directional coupler 605 provides an independent signal that is inverted. The number of wavelengths is $$\frac{3.247}{0.85 \ \mu m}(18.0 \ \mu m + 314.0 \ \mu m + 18.0 \ \mu m) = 1337 \text{ wavelengths}$$

where 3.247 is the effective refractive index of the independent stage waveguide 606 and 0.85 $\mu$m is the wavelength of light used. Reflecting mirrors 33 are used to direct the beams in the independent stage waveguide 606.

Although the invention has been described with reference to certain specific embodiments, various modifications thereof will be apparent to those skilled in the art without departing from the spirit and scope of the invention as outlined in the claims appended hereto.

I claim:

1. A pulse controlled phase modulator device comprising:
   a) a continuous wave coherent input signal;
   b) a pulsed input signal;
   c) a splitter for receiving said continuous wave coherent input signal, said splitter dividing said continuous wave coherent input signal to produce an independent signal and a dependent signal;
   d) an independent stage for receiving said independent signal, said independent stage producing a processed independent signal that is not pulse modulated;
   e) a dependent stage for receiving said pulsed input signal and said dependent signal, said dependent stage pulse modulating said dependent signal to produce a processed dependent signal; and
   f) a combiner for receiving said processed independent signal and said processed dependent signal, said combiner combining said processed independent signal and said processed dependent signal to produce a continuous wave coherent phase modulated output signal.

2. A device according to claim 1 having an ON operating region and an OFF operating region.

3. A device according to claim 2, where in said ON operating region said processed dependent signal is substantially non-negligible and substantially opposite in phase to said processed independent signal and said pulsed input signal is present.

4. A device according to claim 2, where in said OFF operating region said processed dependent signal is substantially negligible in magnitude and said pulsed input signal is not present.

5. A device according to claim 2, where in said ON operating region said output signal is substantially equal in magnitude and substantially opposite in phase to said output signal in said OFF operating region.

6. A device according to claim 1, wherein said signals are laser beams.

7. A device according to claim 1, wherein said independent stage includes at least one amplifier for increasing the magnitude of said independent signal by a predetermined factor.

8. A device according to claim 7, wherein said amplifier is a semiconductor laser amplifier.

9. A device according to claim 1, wherein said independent stage includes at least one phase inverter for making said processed independent signal substantially opposite in phase to said processed dependent signal.

10. A device according to claim 1, wherein said dependent stage comprises:
    a) an amplifying section for receiving said dependent signal, said amplifying section producing a boosted signal; and
    b) a switching section that receives said boosted signal and said pulsed input signal, said switching section pulse modulating said boosted signal to produce said processed dependent signal that is
       substantially non-negligible and substantially opposite in phase to said processed independent signal in said ON operating region and is
       substantially negligible in said OFF operating region.

11. A device according to claim 10, wherein said amplifying section includes at least one amplifier for increasing the magnitude of said dependent signal by a predetermined factor.

12. A device according to claim 11, wherein said at least one amplifier is a semiconductor laser amplifier.

13. A device according to claim 10, wherein said amplifying section includes at least one phase inverter for making said processed dependent signal substantially opposite in phase to said processed independent signal.

14. A device according to claim 10, wherein said switching section includes a transmitting switch.

15. A device according to claim 14, wherein said transmitting switch transmits said boosted signal when said pulsed input signal is present and does not transmit said boosted signal when said pulsed input signal is not present.

16. A device according to claim 14, wherein said transmitting switch partially transmits said boosted signal when said pulsed input signal is present and does not transmit said boosted signal when said pulsed input signal is not present.

17. A device according to claim 14, wherein said transmitting switch is a saturable absorber.

18. A device according to claim 10, wherein said switching section includes at least one phase inverter for making said processed dependent signal substantially opposite in phase to said processed independent signal.

19. A device according to claim 1, wherein said dependent stage comprises:
    a) a switching section that receives said dependent signal and said pulsed input signal, said switching section pulse modulating said dependent signal to produce a switched signal; and
    b) an amplifying section for receiving said switched signal, said amplifying section producing said processed dependent signal that is
       substantially non-negligible and substantially opposite in phase to said processed independent signal in said ON operating region and is
       substantially negligible in said OFF operating region.

20. A device according to claim 19, wherein said switching section includes a transmitting switch.

21. A device according to claim 20, wherein said transmitting switch transmits said dependent signal when said pulsed input signal is present and does not transmit said dependent signal when said pulsed input signal is not present.

22. A device according to claim 20, wherein said transmitting switch partially transmits said dependent signal when said pulsed input signal is present and does not transmit said dependent signal when said pulsed input signal is not present.

23. A device according to claim 20, wherein said transmitting switch is a saturable absorber.

24. A device according to claim 19, wherein said switching section includes at least one phase inverter for making said processed dependent signal substantially opposite in phase to said processed independent signal.

25. A device according to claim 19, wherein said amplifying section comprises:
    a) a boosting segment for receiving said switched signal, said boosting segment providing a boosted signal; and
    b) a filtering segment for receiving said boosted signal, said filtering segment providing said processed dependent signal that is
       substantially non-negligible and substantially opposite in phase to said processed independent signal in said ON operating region and is
       substantially negligible in said OFF operating region.

26. A device according to claim 25, wherein said boosting segment includes at least one amplifier for increasing the magnitude of said switched signal by a predetermined factor.

27. A device according to claim 26, wherein said at least one amplifier is a semiconductor laser amplifier.

28. A device according to claim 25, wherein said boosting segment includes at least one phase inverter for making said processed dependent signal substantially opposite in phase to said processed independent signal.

29. A device according to claim 25, wherein said filtering segment includes a threshold device.

30. A device according to claim 29, wherein said threshold device transmits said boosted signal in said ON operating region when the magnitude of said boosted signal is greater than a predetermined threshold magnitude and when the magnitude of said boosted signal is equal to said predetermined threshold magnitude and does not transmit said boosted signal in said OFF operating region when the magnitude of said boosted signal is less than said predetermined threshold magnitude.

31. A device according to claim 29, wherein said threshold device partially transmits said boosted signal in said ON operating region when the magnitude of said boosted signal is greater than a predetermined threshold magnitude and when the magnitude of said boosted signal is equal to said predetermined threshold magnitude and does not transmit said boosted signal in said OFF operating region when the magnitude of said boosted signal is less than said predetermined threshold magnitude.

32. A device according to claim 29, wherein said threshold device is a saturable absorber.

33. A device according to claim 25, wherein said filtering segment includes at least one phase inverter for making said processed dependent signal substantially opposite in phase to said processed independent signal.

* * * * *